United States Patent
Huang et al.

(10) Patent No.: US 9,532,456 B2
(45) Date of Patent: Dec. 27, 2016

(54) BONDING STRUCTURE OF TOUCH PANEL AND FLEXIBLE CIRCUIT BOARD

(71) Applicant: Hannstar Display Corporation, New Taipei (TW)

(72) Inventors: Yung-Li Huang, Taoyuan County (TW); Yu-Sheng Lin, Taichung (TW); Nan-Cheng Huang, Tainan (TW); Jih-Hsin Chiang, Taoyuan County (TW)

(73) Assignee: HANNSTAR DISPLAY CORPORATION, Taipei (TW)

( * ) Notice: Subject to any disclaimer, the term of this patent is extended or adjusted under 35 U.S.C. 154(b) by 512 days.

(21) Appl. No.: 13/727,613

(22) Filed: Dec. 27, 2012

(65) Prior Publication Data

US 2014/0078691 A1    Mar. 20, 2014

(30) Foreign Application Priority Data

Sep. 20, 2012   (CN) .......................... 2012 1 0352876

(51) Int. Cl.
*H05K 1/18* (2006.01)
*H05K 1/02* (2006.01)
(Continued)

(52) U.S. Cl.
CPC ............. *H05K 1/181* (2013.01); *G06F 3/0416* (2013.01); *H05K 1/0268* (2013.01); *H05K 3/323* (2013.01);
(Continued)

(58) Field of Classification Search
CPC ..... G06F 3/0416; H05K 1/0268; H05K 1/181; H05K 3/323; H05K 2201/09663; H05K 3/361
(Continued)

(56) References Cited

U.S. PATENT DOCUMENTS 7,371,971 B2 * 5/2008 Takayoshi ............ H05K 1/0269
                                                    174/254
8,274,634 B2 * 9/2012 Oikawa ................... G06F 3/045
                                                    349/150
(Continued)

FOREIGN PATENT DOCUMENTS

CN          202035211         11/2011
CN          102541318         7/2012

OTHER PUBLICATIONS

The Free Dictionary http://www.thefreedictionary.com/colloid Definition of colloid by the Free Dictionary.*

(Continued)

*Primary Examiner* — Steven T Sawyer
*Assistant Examiner* — Ahmad D Barnes
(74) *Attorney, Agent, or Firm* — Jianq Chyun IP Office

(57) ABSTRACT

A bonding structure of a touch panel and a flexible circuit board includes a touch panel, a flexible circuit board and a conductive adhesive film. The touch panel includes a shielding layer and multiple transmission wires disposed on the shielding layer. The flexible circuit board is under the touch panel and includes a substrate and multiple connection wires on the substrate. Each the connection wire includes a first connection portion and a second connection portion, and the two connection portions are separated from each other by an interval and electrically insulated from each other. The conductive adhesive film is between the transmission wires of the touch panel and the connection wires of the flexible circuit board, in which the first connection portions and the second connection portions of the connection wires are electrically connected to the transmission wires via the conductive adhesive film so as to form an electric loop.

14 Claims, 2 Drawing Sheets

(51) Int. Cl.
*H05K 3/32* (2006.01)
*G06F 3/041* (2006.01)
*H05K 3/36* (2006.01)

(52) U.S. Cl.
CPC ..... *H05K 3/361* (2013.01); *H05K 2201/09663* (2013.01)

(58) Field of Classification Search
USPC ............... 361/748, 679.01, 600, 720, 736, 361/749–750, 767, 785; 174/250, 174/254–268; 345/173, 174
See application file for complete search history.

(56) References Cited

U.S. PATENT DOCUMENTS

| | | | |
|---|---|---|---|
| 2009/0102812 A1* | 4/2009 | Fujii et al. .................... | 345/174 |
| 2009/0315856 A1 | 12/2009 | Oikawa et al. | |
| 2011/0285655 A1* | 11/2011 | Nakanishi et al. .......... | 345/173 |
| 2013/0248230 A1* | 9/2013 | Park et al. ................... | 174/255 |

OTHER PUBLICATIONS

Office Action of China Counterpart Application, issued on Dec. 31, 2015, p. 1-p. 5, in which the listed references were cited.

\* cited by examiner

BONDING STRUCTURE OF TOUCH PANEL AND FLEXIBLE CIRCUIT BOARD

CROSS-REFERENCE TO RELATED APPLICATION

This application claims the priority benefit of China application serial no. 201210352876.3, filed on Sep. 20, 2012. The entirety of the above-mentioned patent application is hereby incorporated by reference herein and made a part of this specification.

BACKGROUND OF THE INVENTION

Field of the Invention

The invention generally relates to a bonding structure, and more particularly, to a bonding structure of a touch panel and a flexible circuit board.

Description of Related Art

Touch technology in recent years has been widely used in various multimedia electronic products, especially in portable mobile products, such as mobile phones, e-books, tablet computers, and so on. By using touch technology as an input means, it can effectively replace the current input methods of keyboard or mouse. In addition to convenience, due to the operation intuitive property, the touch input technology has become a very popular interactive way between the man-machine interface and the multimedia.

Generally, the touch panel is electrically connected to a driving device through a circuit board so that the touch signal of the touch panel can be transmitted into the driving device. Since the circuit board is bonded at the peripheral region of the touch panel, while the peripheral area of the touch panel usually has a black matrix layer for shielding the transmission wires. Therefore, under the shielding of the opaque black matrix layer, the user can not clearly judge out (inspect) the bonding state between the transmission wires on the touch panel and the connection wires on the flexible circuit board (FCB). How to more accurately and clearly judge out the bonding state between the transmission wires under the black matrix layer and the connection wires on the flexible circuit board seems to become an important next project for assembling technology between the touch panel and the flexible circuit board.

SUMMARY OF THE INVENTION

Accordingly, the invention is directed to a bonding structure of a touch panel and a flexible circuit board so that users can easily and clearly confirm whether the flexible circuit board is effectively bonded with the touch panel.

In order to achieve the above-mentioned object, the invention provides a bonding structure of a touch panel and a flexible circuit board. The bonding structure includes a touch panel, a flexible circuit board and a conductive adhesive film. The touch panel includes a plurality of transmission wires and a shielding layer, in which the transmission wires are disposed on the shielding layer. The flexible circuit board is disposed under the touch panel and includes a substrate and a plurality of connection wires disposed on the substrate, in which each of the connection wires includes a first connection portion and a second connection portion, and the first connection portion is separated from the second connection portion by an interval and electrically insulated from the second connection portion. The conductive adhesive film is disposed between the transmission wires of the touch panel and the connection wires of the flexible circuit board, in which the first connection portions and the second connection portions of the connection wires are electrically connected to the transmission wires via the conductive adhesive film so as to form an electric loop.

In an embodiment of the invention, the touch panel has a touching region and a peripheral region surrounding the touching region, and the shielding layer is disposed at the peripheral region.

In an embodiment of the invention, the interval is between 10 μm and 30 μm.

In an embodiment of the invention, the orthogonal projections of the transmission wires on the flexible circuit board are respectively overlapped with the orthogonal projections of the first connection portions and the second connection portions of the corresponding connection wires on the flexible circuit board.

In an embodiment of the invention, a material of the conductive adhesive film is an anisotropic conductive adhesive.

In an embodiment of the invention, the anisotropic conductive adhesive includes a colloidal body and a plurality of conductive particles distributed in the colloidal body, in which the flexible circuit board is electrically connected to the touch panel through the conductive particles.

In an embodiment of the invention, the particle diameter of each of the conductive particles is between 3 μm and 3.5 μm.

In an embodiment of the invention, a thickness of the conductive adhesive film is between 16 μm and 20 μm.

In an embodiment of the invention, the materials of the transmission wires and the connection wires include metal or metal oxide.

In an embodiment of the invention, the touch panel includes a resistive touch panel, a capacitive touch panel, an optical touch panel or a surface acoustic wave touch panel.

Based on the description above, by the design of the connection wires in the invention, when bonding the flexible circuit board to the touch panel, the conductive adhesive film is able to make the transmission wires electrically connected to the first connection portions and the second connection portions of the connection wires to form an electric loop so as to indicate an effective bonding state between the flexible circuit board and the touch panel is established. In comparison with the current judgement way on the current bonding state between the transmission wires and the connection wires under the black matrix layer through the intuitive observation by the human eyes in the prior art, the invention can more easily and clearly confirm whether the bonding between the flexible circuit board and the touch panel is an effective bonding by using electrical turning-on way.

In order to make the features and advantages of the present invention more comprehensible, the present invention is further described in detail in the following with reference to the embodiments and the accompanying drawings.

DESCRIPTION OF THE EMBODIMENTS

Figure 1A:
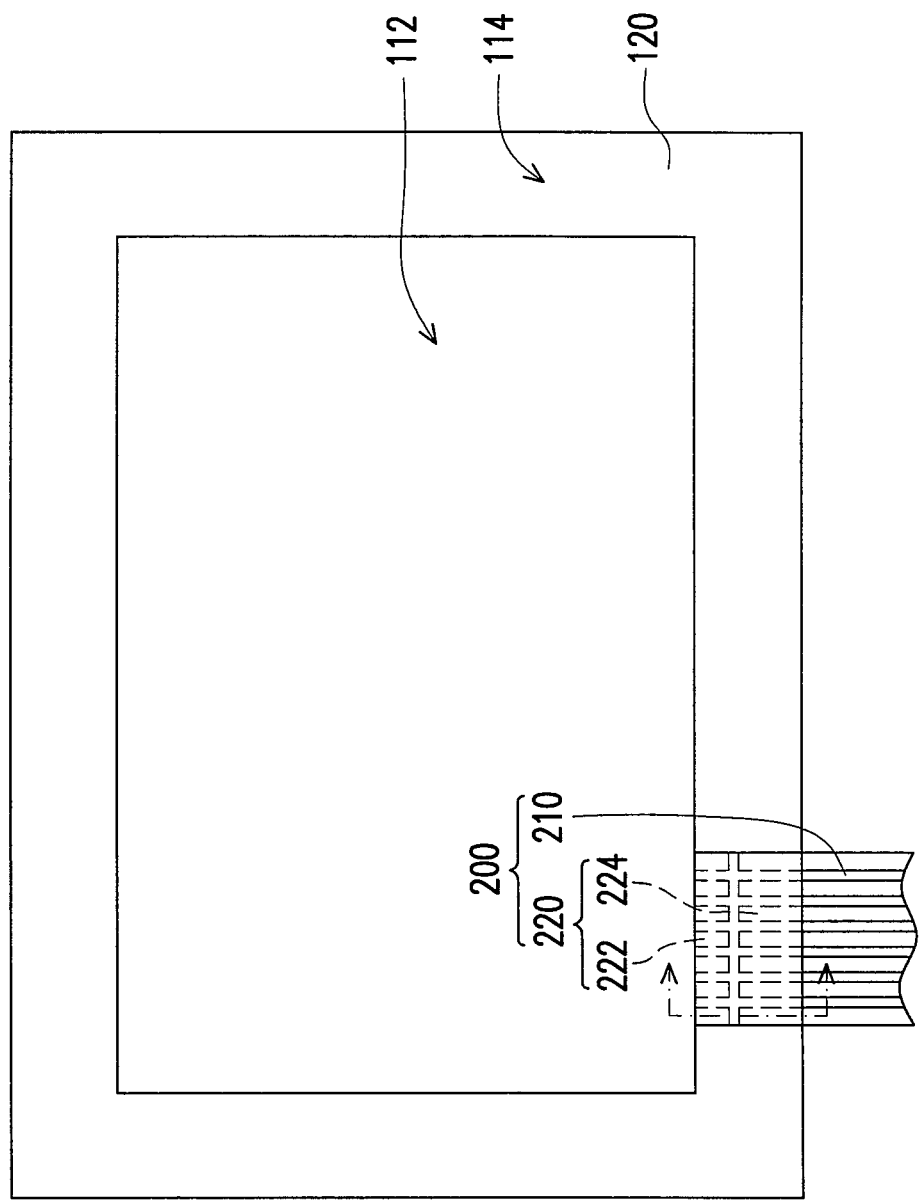
FIG. 1A is a top-view diagram of a bonding structure of a touch panel and a flexible circuit board according to an embodiment of the invention.
Figure 1B:
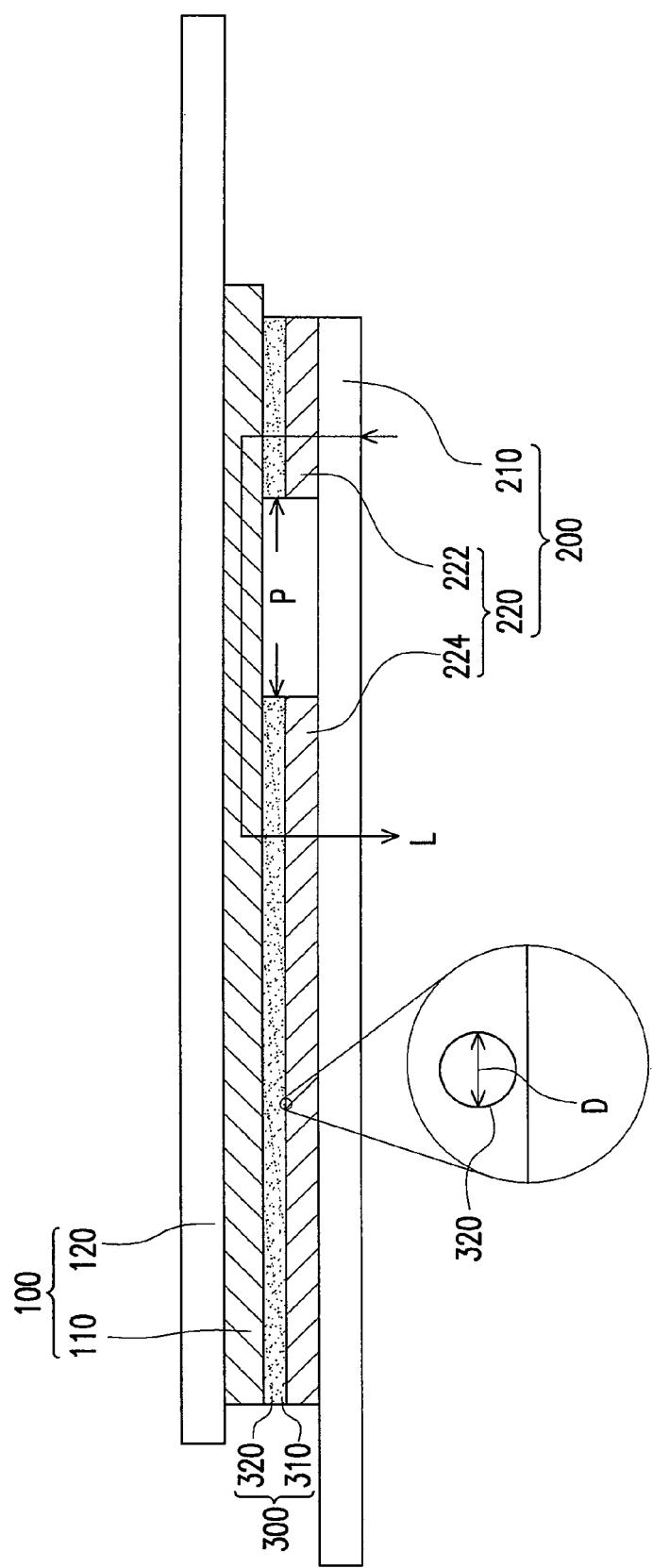
FIG. 1B is a partial cross-sectional diagram of the bonding structure of the touch panel and the flexible circuit board of FIG. 1A.

FIG. 1A is a top-view diagram of a bonding structure of a touch panel and a flexible circuit board according to an embodiment of the invention and FIG. 1B is a partial cross-sectional diagram of the bonding structure of the touch panel and the flexible circuit board of FIG. 1A. Referring to FIGS. 1A and 1B, in the embodiment, the bonding structure of a touch panel and a flexible circuit board includes a touch panel 100, a flexible circuit board 200 and a conductive adhesive film 300. The touch panel 100 includes a plurality of transmission wires 110 and a shielding layer 120, in which the transmission wires 110 are disposed on the shielding layer 120. The flexible circuit board 200 is disposed under the touch panel 100 and includes a substrate 210 and a plurality of connection wires 220 disposed on the substrate 210. Each of the connection wires 220 includes a first connection portion 222 and a second connection portion 224. Specifically, the first connection portion 222 and the second connection portion 224 are separated from an interval P and electrically insulated from each other. The conductive adhesive film 300 is disposed between the transmission wires 110 of the touch panel 100 and the connection wires 220 of the flexible circuit board 200, in which the first connection portions 222 and the second connection portions 224 of the connection wires 220 are electrically connected to the transmission wires 110 through the conductive adhesive film 300 to form an electric loop L.

In more details, in the embodiment, the touch panel 100 has a touching region 112 and a peripheral region 114 surrounding the touching region 112, and the shielding layer 120 is disposed at the peripheral region 114. The shielding layer 120 herein is, for example, a black matrix layer made of, for example, resin, metal oxide or other appropriate materials having good light shielding effect and low-reflection characteristic. The touch panel 100 is, for example, a resistive touch panel, a capacitive touch panel, an optical touch panel or a surface acoustic wave touch panel. The orthogonal projections of the transmission wires 110 on the flexible circuit board 200 in the embodiment are respectively overlapped with the orthogonal projections of the first connection portions 222 and the second connection portions 224 of the corresponding connection wires 220 on the flexible circuit board 200. The first connection portion 222 of the connection wires 220 is separated from the second connection portion 224 by an interval P and the interval P is between 10 μm and 30 μm. The material of the transmission wires 110 and the material of the connection wires 220 are, for example, copper or gold or metal oxides such as antimony tin oxide film (ATO film) or indium tin oxide film (ITO film). Since the transmission wires 110 are disposed on the shielding layer 120 and the transmission wires 110 are located between the shielding layer 120 and the flexible circuit board 200, the shielding layer 120 is able to shield the transmission wires 110 to keep the nice appearance of the touch panel 100.

In the embodiment, a material of the conductive adhesive film 300 is an anisotropic conductive adhesive. The anisotropic conductive adhesive includes a colloidal body 310 and a plurality of conductive particles 320, in which the conductive particles 320 are distributed in the colloidal body 310, and the flexible circuit board 200 is electrically connected to the touch panel 100 through the conductive particles 320. The particle diameter D of each of the conductive particles 320 herein is, for example, between 3 μm and 3.5 μm while a thickness of the conductive adhesive film 300 is between, for example, 16 μm and 20 μm.

In the embodiment, since the conductive adhesive film 300 is located between the transmission wires 110 and the connection wires 220, so that it can judge whether the bonding between the flexible circuit board 200 and the touch panel 100 is an effective bonding by whether or not an electric loop L is established between the conductive adhesive film 300, the transmission wires 110 and the first connection portions 222 and second connection portions 224 of the connection wires 220. That is to say, when the conductive adhesive film 300 is electrically connected to the transmission wires 110 and the first connection portions 222 and second connection portions 224 of the connection wires 220 to form an electric loop L, it indicates the bonding between the flexible circuit board 200 and the touch panel 100 is an effective bonding. On the contrary, if it fails to establish an electric loop L between the conductive adhesive film 300, the transmission wires 110 and the first connection portions 222 and second connection portions 224 of the connection wires 220, it indicates the bonding between the flexible circuit board 200 and the touch panel 100 is an ineffective bonding. Therefore, in comparison with the current judgement way on the bonding state between the transmission wires and the connection wires under the black matrix layer through the intuitive observation by the human eyes in the prior art, the invention can more easily and clearly confirm whether the bonding between the flexible circuit board 200 and the touch panel 100 is an effective bonding by judging whether or not the connections between the first connection portions 222 and the second connection portions 224 of the connection wires 220 are turned on.

Based on the description above, by the design of the connection wires in the invention, when bonding the flexible circuit board to the touch panel, the conductive adhesive film is able to make the transmission wires electrically connected to the first connection portions and the second connection portions of the connection wires to form an electric loop so as to indicate an effective bonding state between the flexible circuit board and the touch panel is established. In comparison with the current judgement way on the bonding state between the transmission wires and the connection wires under the black matrix layer through the intuitive observation by the human eyes in the prior art, the invention can more easily and clearly confirm whether the bonding between the flexible circuit board and the touch panel is an effective bonding by using electrical turning-on way.

It will be apparent to those skilled in the art that the descriptions above are several preferred embodiments of the invention only, which does not limit the implementing range of the invention. Various modifications and variations can be made to the structure of the invention without departing from the scope or spirit of the invention. The claim scope of the invention is defined by the claims hereinafter.

What is claimed is:

1. A bonding structure of a touch panel and a flexible circuit board, comprising:
   a touch panel, comprising a plurality of transmission wires and a light shielding layer, wherein the transmission wires are disposed on the light shielding layer;
   a flexible circuit board, disposed under the touch panel and comprising a substrate and a plurality of connection wires disposed on the substrate, wherein each of the connection wires comprises a first connection portion and a second connection portion, and the first connection portion is separated from the second connection portion by an interval mid electrically insulated from the second connection portion; and
   a conductive adhesive film, disposed between the transmission wires of the touch panel and the connection wires of the flexible circuit board, wherein the first connection portions and the second connection portions of the connection wires are electrically connected to the transmission wires via the conductive adhesive film so as to form an electric loop;

wherein the anisotropic conductive adhesive comprises: a colloidal body; and a plurality of conductive particles, distributed in the colloidal body, wherein the flexible circuit board is electrically connected to the touch panel through the conductive particles;

wherein the particle diameter of each of the conductive particles is between 3 μm and 3.5 μm.

2. The bonding structure of the touch panel and the flexible circuit board as claimed in claim 1, wherein the touch panel has a touching region and a peripheral region surrounding the touching region, and the light shielding layer is disposed at the peripheral region.

3. The bonding structure of the touch panel and the flexible circuit board as claimed in claim 1, wherein the interval is between 10 μm and 30 μm.

4. The bonding structure of the touch panel and the flexible circuit board as claimed in claim 1, wherein a material of the conductive adhesive film is an anisotropic conductive adhesive.

5. The bonding structure of the touch panel and the flexible circuit board as claimed in claim 1, wherein a thickness of the conductive adhesive film is between 16 μm and 20 μm.

6. The bonding structure of the touch panel and the flexible circuit board as claimed in claim 1, wherein materials of the transmission wires and the connection wires comprise metal or metal oxide.

7. The bonding structure of the touch panel and the flexible circuit board as claimed in claim 1, wherein the touch panel comprises a resistive touch panel, a capacitive touch panel, an optical touch panel or a surface acoustic wave touch panel.

8. A bonding structure of a touch panel and a flexible circuit board, comprising:

a touch panel, comprising a plurality of transmission wires and a light shielding layer, wherein the transmission wires are disposed on the light shielding layer;

a flexible circuit board, disposed under the touch panel and comprising a substrate and a plurality of connection wires disposed on the substrate, wherein each of the connection wires comprises a first connection portion and a second connection portion, and the first connection portion is separated from the second connection portion by an interval and electrically insulated from the second connection portion, and orthogonal projections of the transmission wires on the flexible circuit board are respectively overlapped with orthogonal projections of the first connection portions and the second connection portions of the corresponding connection wires on the flexible circuit board; and a conductive adhesive film, disposed between the transmission wires of the touch panel and the connection wires of the flexible circuit board, wherein the first connection portions and the second connection portions of the connection wires are electrically connected to the transmission wires via the conductive adhesive film so as to form an electric loop;

wherein the anisotropic conductive adhesive comprises: a colloidal body; and a plurality of conductive particles, distributed in the colloidal body, wherein the flexible circuit board is electrically connected to the touch panel through the conductive particles;

wherein the particle diameter of each of the conductive particles is between 3 μm and 3.5 μm.

9. The bonding structure of the touch panel and the flexible circuit board as claimed in claim 8, wherein the touch panel has a touching region and a peripheral region surrounding the touching region, and the light shielding layer is disposed at the peripheral region.

10. The bonding structure of the touch panel and the flexible circuit board as claimed in claim 8, wherein the interval is between 10 μm and 30 μm.

11. The bonding structure of the touch panel and the flexible circuit board as claimed in claim 8, wherein a material of the conductive adhesive film is an anisotropic conductive adhesive.

12. The bonding structure of the touch panel and the flexible circuit board as claimed in claim 8, wherein a thickness of the conductive adhesive film is between 16 μm and 20 μm.

13. The bonding structure of the touch panel and the flexible circuit board as claimed in claim 8, wherein materials of the transmission wires and the connection wires comprise metal or metal oxide.

14. The bonding structure of the touch panel and the flexible circuit board as claimed in claim 8, wherein the touch panel comprises a resistive touch panel, a capacitive touch panel, an optical touch panel or a surface acoustic wave touch panel.

\* \* \* \* \*